US007652480B2

(12) United States Patent
Mollet

(10) Patent No.: US 7,652,480 B2
(45) Date of Patent: Jan. 26, 2010

(54) METHODS AND SYSTEMS FOR TESTING A FUNCTIONAL STATUS OF A LIGHT UNIT

(75) Inventor: Samuel Robert Mollet, Grain Valley, MO (US)

(73) Assignee: General Electric Company, Schenectady, NY (US)

( * ) Notice: Subject to any disclaimer, the term of this patent is extended or adjusted under 35 U.S.C. 154(b) by 303 days.

(21) Appl. No.: 11/796,056

(22) Filed: Apr. 26, 2007

(65) Prior Publication Data

US 2008/0265262 A1 Oct. 30, 2008

(51) Int. Cl.
*G01R 31/08* (2006.01)

(52) U.S. Cl. ..................... 324/522; 324/76.11; 324/767

(58) Field of Classification Search ................. 324/522, 324/767, 713, 76.11
See application file for complete search history.

(56) References Cited

U.S. PATENT DOCUMENTS 4,309,639 A 1/1982 Thrower, Jr. et al.
5,578,936 A * 11/1996 Gibson et al. ............... 324/767
5,612,680 A 3/1997 DeSanto
6,066,105 A 5/2000 Guillen
6,097,302 A 8/2000 Zinzell
6,114,830 A 9/2000 Luo
6,153,985 A 11/2000 Grossman
6,198,403 B1 3/2001 Dorrough et al.
6,392,553 B1 5/2002 Mollet et al.
7,049,769 B2 5/2006 Boulouednine et al.
7,250,872 B2 * 7/2007 Klinger ...................... 340/642
2003/0042908 A1 3/2003 St-Germain
2006/0015272 A1 1/2006 Giraldo

FOREIGN PATENT DOCUMENTS

DE 10336973 A1 3/2005
WO 2007133241 A1 11/2007

* cited by examiner

*Primary Examiner*—Vincent Q Nguyen
(74) *Attorney, Agent, or Firm*—John A. Kramer, Esq.; Armstrong Teasdale LLP

(57) ABSTRACT

A method for testing a status of a light unit is provided, wherein the method includes electrically coupling the light unit to a controller and transmitting a negative voltage from the controller to the light unit. The method also includes detecting at least one of current and voltage passing through the light unit and determining a status of the light unit based on at least one of the detected current and detected voltage.

12 Claims, 1 Drawing Sheet

METHODS AND SYSTEMS FOR TESTING A FUNCTIONAL STATUS OF A LIGHT UNIT

BACKGROUND OF THE INVENTION

This invention relates generally to light units, and more specifically, to methods and systems for use in testing a functional status of a light unit.

Colored signals are commonly used in railway systems to indicate route availability and/or speed requirements. At least some known signals include incandescent lights having colored covers. Other known signals include colored non-incandescent lights, such as light emitting diodes (LEDs). Typically, light emitting diodes are preferred because they have a longer life-span, operate with lower power consumption, and provide better visibility. Regardless of whether a railway system includes incandescent lights or LEDs, the signals are required to be tested periodically to determine their functional status.

Generally, incandescent lights are tested using known cold filament testing methods. Specifically, when the light is not in use, a plurality of repeated pulses are transmitted to the incandescent light over a predetermined time period. During the transmission of the pulses, the amount of current draw from the incandescent light is measured to ensure functionality of the light. Generally, cold filament testing is an acceptable testing methodology with incandescent lights because the lights require a warm-up time before visible light is transmitted therefrom. Because cold filament testing uses repeated pulses, the incandescent lights are not provided time to warm-up and, as such, no visible light is inadvertently emitted from the incandescent light during the testing process.

In contrast, non-incandescent lights have a quick warm-up time, and therefore, emit visible light during cold filament testing. Such light emission is unacceptable because railway operators may confuse the light emitted during testing as a warning signal. Accordingly, cold filament testing is generally unavailable when the railway system includes non-incandescent lights. One known solution to the unavailability of cold filament testing is to electrically couple the non-incandescent light to a standard VLD card and provide an intermediate set of electronics that make the non-incandescent light appear as an incandescent light to the VLD diagnostic routines. However, this approach fails to limit power requirements during testing, and increases the complexity and costs associated with testing the light unit.

BRIEF DESCRIPTION OF THE INVENTION

In one embodiment, a method for testing a status of a light unit is provided, wherein the method includes electrically coupling the light unit to a controller and transmitting a negative voltage from the controller to the light unit. The method also includes detecting at least one of current and voltage passing through the light unit and determining a status of the light unit based on at least one of the detected current and detected voltage.

In another embodiment, a system for testing a status of a light unit is provided, wherein the system includes a light unit and a controller electrically coupled to the light unit. The controller is configured to transmit negative voltage to the light unit and to detect at least one of current and voltage passing through the light unit. The system is configured to determine a status of the light unit based on at least one of the detected current and detected voltage.

In yet another embodiment, a light emitting diode (LED) array is provided, wherein the array includes a controller and a plurality of light emitting diodes electrically coupled to the controller. The plurality of light emitting diodes are configured to receive negative voltage from the controller to facilitate testing a status of the plurality of light emitting diodes.

DETAILED DESCRIPTION OF THE INVENTION

The present invention provides a method and system that may be used for testing the functional status of a light unit. In one embodiment, the system includes a light unit and a controller that is electrically coupled to the light unit. The controller is configured to transmit a negative voltage to the light unit and to detect the current and/or the voltage passing through the light unit. The present invention also provides a light emitting diode (LED) array that includes a plurality of light emitting diodes that are electrically coupled to a controller for receiving a negative voltage from the controller to facilitate testing the functional status of the light emitting diodes.

The present invention relates to railroad signals, and in particular, to testing the functional status of a railroad light unit. In particular, railway systems commonly use light units to indicate route availability and speed requirements. Recently, non-incandescent lights, such as light emitting diodes (LEDs), have been incorporated into railway signal systems. The present invention provides a system and method for cold-filament testing the functionality of a non-incandescent light unit. More specifically, the present invention provides a system and method that enables cold-filament testing of a non-incandescent light unit without causing light to be emitted from the light unit during the testing process. While the present invention is described in relation to railroad signals, it would be understood by one skilled in the art that the present invention may also be applicable to other signals and light units. Further, as will be appreciated by one skilled in the art, the present invention may also have applicability to incandescent light systems.

Figure 1:
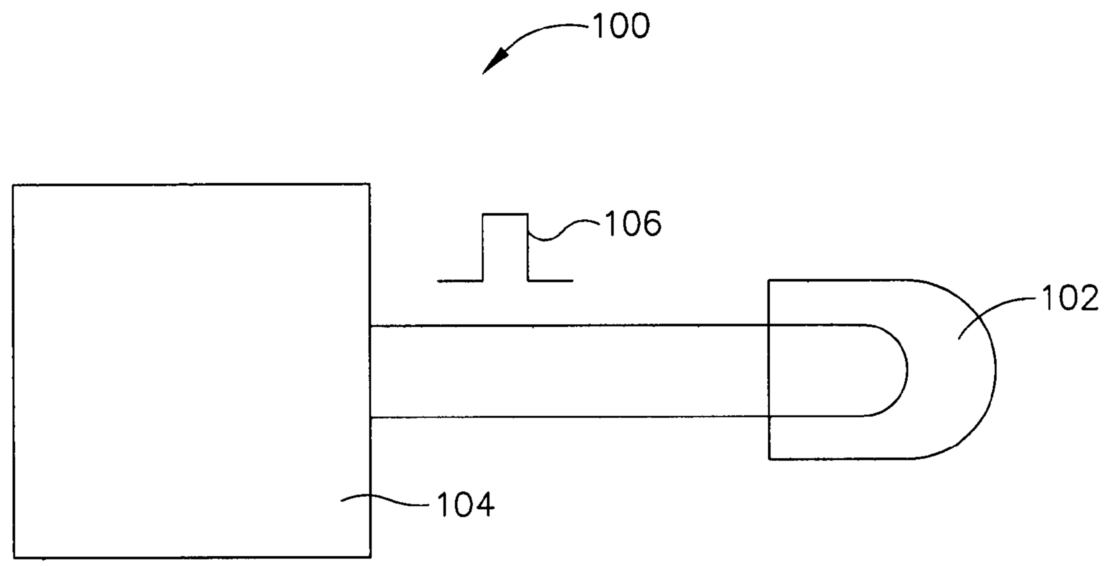
FIG. 1 (PRIOR ART)
FIG. 1 is a schematic view of an exemplary known system used for operating and testing a light unit.

FIG. 1 is a schematic view of an exemplary system 100 that may be used for testing and operating a light unit 102. Light unit 102 is electrically coupled to a controller 104. In the exemplary embodiment, light unit 102 is an incandescent light. As such, as is known in the art, light unit 102 requires a substantial warm-up time before emitting visible light. Accordingly, during normal operations, controller 104 activates light unit 102 by transmitting a continuous positive voltage thereto. Over time, the continuous positive voltage facilitates warming light unit 102, such that visible light is emitted therefrom.

To test light unit 102, system 100 uses cold-filament testing. Specifically, when light unit 102 is not in use, a plurality of repeated pulses 106, having a positive voltage, are transmitted to light unit 102 over a period of several seconds. When light unit 102 is functional, controller 104 receives a return signal from light unit 102 that is indicative of the functionality of light unit 102. Because, controller 104 only transmits pulses, light unit 102 is not warmed, and light unit 102 is prevented from emitting visible light during testing.

As would be understood by one skilled in the art, system 100 is inoperable with a non-incandescent light unit. Specifically, system 100 would not be operable for testing the functionality of a non-incandescent light unit. In particular, because non-incandescent lights do not require a warm-up time, as is required by incandescent lights, cold-filament testing of a non-incandescent light would cause light to be emitted from the non-incandescent light during the testing. Such conditions are generally unacceptable in a railway system because the light emitted during testing may be mistaken as a warning signal or any similar type of railway operation signal.

Figure 2:
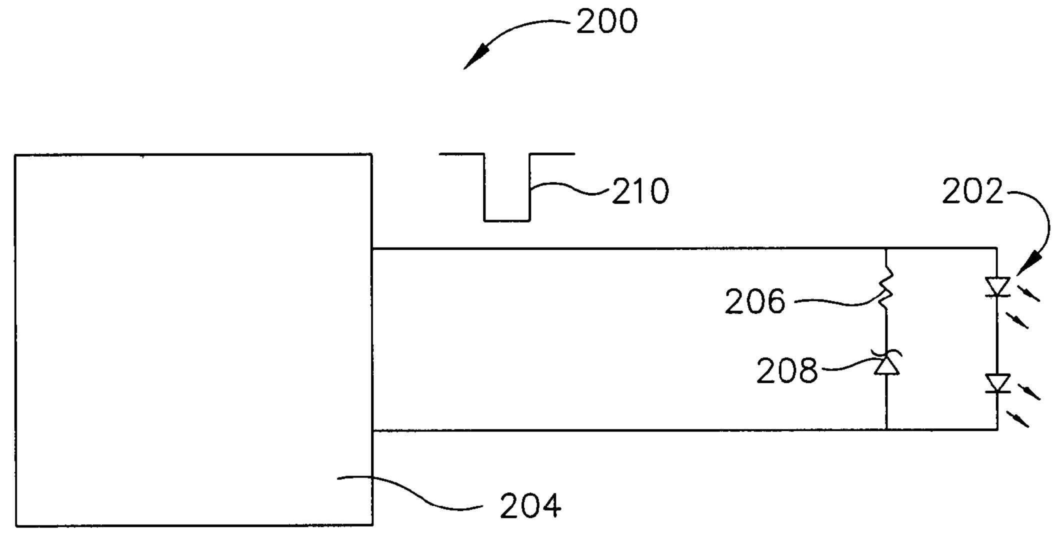
FIG. 2 is a schematic view of an exemplary system that may be used to operate and test a light unit.

FIG. 2 is a schematic view of an exemplary system 200 that may be used for operating and testing a light unit 202. System 200 includes light unit 202, a controller 204, a resistor 206, and a diode 208. In the exemplary embodiment, resistor 206 and diode 208 are electrically coupled in series and both resistor 206 and diode 208 are electrically coupled in parallel with light unit 202.

In the exemplary embodiment, light unit 202 includes an array of light emitting diodes (LEDs). In an alternative embodiment, light unit 202 includes only one LED. As will be appreciated by one skilled in the art, light unit 202 is not limited to including LEDs, but rather, may include any non-incandescent lights. In one embodiment, the LEDs are electrically coupled together in parallel. In another embodiment, the LEDs are electrically coupled together in series. In a further embodiment, the LEDs are electrically coupled together with a combination of parallel and series connections.

Moreover, in the exemplary embodiment, controller 204 is a solid state LED controller. In another embodiment, controller 204 is any controller that enables system 200 to function as described herein. Moreover, in the exemplary embodiment, diode 208 is a Zener diode. In another embodiment, diode 208 is any diode that enables system 200 to function as described herein.

During normal operation, controller 204 activates light unit 202 by transmitting a continuous positive voltage thereto, such that visible light is emitted from light unit 200. During testing, system 200 uses cold-filament testing to determine a functional status of light unit 202. However, in contrast, to the cold filament testing that is used to test system 100 (shown in FIG. 1) system 200 uses negative voltage. Specifically, when light unit 202 is not in use, a plurality of repeated pulses 210, having a negative voltage, are transmitted to light unit 202 over a period of several seconds. When light unit 202 is functional, either the current and/or the voltage passing through light unit 202 is detected by controller 204. The magnitude of the current or voltage detected is indicative of the functional status of light unit 202. Specifically, due to the high reliability of a simple LED array, the functional status of light unit 202 is assumed to be good. The test confirms that light unit 202 is connected. Specifically, it confirms that there are no open wires in light unit 202 and that the input is not shorted. Because, controller 204 transmits negative pulses, light unit 202 is prevented from emitting visible light during testing. Specifically, LEDs only emit light when subjected to a positive voltage. Further, in the exemplary embodiment, negative pulses 210 facilitate reducing an amount of power required to test the functional status of light unit 202.

Further, during testing, resistor 206 and diode 208 cooperate to function as a fail-safe device. Specifically, resistor 206 and diode 208 facilitate preventing a violation of vital trace spacing (VTS). In the exemplary embodiment, the VTS is approximately 0.2" or 0.25". Further, in the exemplary embodiment, the VTS is necessary to prevent a shorted (or partially shorted) resistor 206 from emulating the LED circuit. Moreover, in the exemplary embodiment, resistor 206 and diode 208 protect light unit 202 from reverse bias, while allowing detection of light unit 202 by controller 204. Specifically, in a first mode of testing, using a positive current, the combination of resistor 206 and diode 208 will not respond to positive current and will not interfere with light unit 202. However, in the first mode of testing, light unit 202 will emit light. In a second mode of testing, using a negative current, light unit 202 will not respond, but the combination of resistor 206 and diode 208 will respond and indicate that light unit 202 is functional.

In one embodiment, a method for testing a status of a light unit is provided. The method includes electrically coupling the light unit to a controller, transmitting a negative voltage from the controller to the light unit, detecting at least one of current and voltage passing through the light unit, and determining a status of the light unit based on at least one of the detected current and detected voltage. In one embodiment, the light unit includes at least one light emitting diode (LED) and the method includes coupling the at least one LED to the controller. In another embodiments the controller is a solid state LED controller and the method includes coupling the at least one LED to the solid state LED controller. In the exemplary embodiment, the method includes transmitting negative voltage from the controller to the light unit to facilitate preventing visible light from being emitted from the light unit. In the exemplary embodiment, the method also includes electrically coupling a fail-safe resistor in parallel with the light unit. In one embodiment, the method includes coupling the fail-safe resistor in parallel with the light unit to facilitate protecting the light unit from reverse bias. In the exemplary embodiment, the method includes electrically coupling the light unit to a controller that facilitates activating the light unit when the light unit is not being tested.

The above-described systems and methods provide a system for cold-filament testing of a non-incandescent light unit. Specifically, the above-described systems and methods provide a system that enables cold-filament testing of a non-incandescent light unit without causing light to be emitted from the light unit. As such, non-incandescent railroad light units are capable of being tested without creating a false signal that may impair railway traffic and/or safety. Moreover, non-incandescent railroad light units are capable of being tested without requiring additional circuitry. As such, above described systems and methods facilitate reducing costs associated with testing, installing, and/or maintaining non-incandescent railroad light units.

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Exemplary embodiments of systems and methods for testing a functional status of a light unit are described above in detail. The systems and methods illustrated are not limited to the specific embodiments described herein, but rather, components of the system may be utilized independently and separately from other components described herein. Further, steps described in the method may be utilized independently and separately from other steps described herein.

While the invention has been described in terms of various specific embodiments, those skilled in the art will recognize that the invention can be practiced with modification within the spirit and scope of the claims.

What is claimed is:

1. A method for testing a status of a light unit, said method comprising:

electrically coupling the light unit to a controller;

transmitting a negative voltage from the controller to the light unit during a testing mode of the light unit;

detecting at least one of current and/or voltage passing through the light unit resulting from the negative voltage; and determining a status of the light unit based on at least one of the detected current and/or detected voltage;

wherein in the testing mode no positive voltage signals are applied to the light unit, to prevent the light unit from emitting visible light during the testing mode, and wherein the testing mode encompasses all electrical signals applied to the to the light unit for testing purposes.

2. A method in accordance with claim 1 wherein the light unit includes at least one light emitting diode (LED), said method comprises coupling the at least one LED to the controller.

3. A method in accordance with claim 2 wherein the controller is a solid state LED controller, said method comprises coupling the at least one LED to the solid state LED controller.

4. A method in accordance with claim 1 further comprising electrically coupling a fail-safe resistor and diode in parallel with the light unit.

5. A method in accordance with claim 4 further comprising coupling the fail-safe resistor and diode in parallel with the light unit to facilitate protecting the light unit from reverse bias.

6. A method in accordance with claim 1 further comprising electrically coupling the light unit to a controller that facilitates activating the light unit when the light unit is not being tested.

7. A system for testing a status of a light unit, said system comprising:

a light unit; and a controller electrically coupled to said light unit, said controller configured to transmit negative voltage to said light unit in a testing mode and to detect at least one of current and/or voltage passing through said light unit as a result of the negative voltage, said system configured to determine a status of said light unit based on at least one of the detected current and/or detected voltages;

wherein in the testing mode no positive voltage signals are applied to the light unit, to prevent the light unit from emitting visible light during the testing mode, and wherein the testing mode encompasses all electrical signals applied to the light unit for testing purposes.

8. A system in accordance with claim 7 wherein said light unit comprises at least one light emitting diode (LED).

9. A system in accordance with claim 8 wherein said controller is a solid state LED controller.

10. A system in accordance with claim 7 further comprising a fail-safe resistor and diode electrically coupled in parallel with said light unit.

11. A system in accordance with claim 10 wherein said fail-safe resistor and diode facilitate protecting said light unit from reverse bias.

12. A system in accordance with claim 7 wherein said controller transmits the negative voltage to facilitate reducing an amount of power required to test the status of said light unit.

* * * * *